United States Patent [19]

Walker

[11] 4,370,618

[45] Jan. 25, 1983

[54] CIRCUIT FOR RECOGNIZING CYCLICALLY OCCURRING PULSE SEQUENCES

[75] Inventor: Michael J. Walker, West Midlands, England

[73] Assignee: Lucas Industries Limited, Birmingham, England

[21] Appl. No.: 152,121

[22] Filed: May 21, 1980

[30] Foreign Application Priority Data

May 25, 1979 [GB] United Kingdom ............... 791388

[51] Int. Cl.³ .................. H03K 5/19; H03K 21/30; H03K 21/36
[52] U.S. Cl. .................. 328/120; 328/119; 328/130; 328/48
[58] Field of Search ............. 328/119, 120, 129, 130, 328/75, 48

[56] References Cited

U.S. PATENT DOCUMENTS 3,936,745 2/1976 Harrington .................. 328/129 X
3,997,798 12/1976 Breimesser .................. 328/130 X
4,023,109 5/1977 Shreve .................. 328/75
4,152,655 5/1979 Przybyla et al. .................. 328/120
4,164,712 8/1979 Collins .................. 328/48
4,227,154 10/1980 Ebert .................. 328/129 X Primary Examiner—John S. Heyman
Attorney, Agent, or Firm—Trexler, Bushnell & Wolters, Ltd.

[57] ABSTRACT

A circuit for recognizing cyclically occurring pulse sequences includes a counter controlled by a D-type flip-flop circuit to start counting the pulses in the pulse sequence when a specific pulse event occurs. The output of the counter is compared by a comparator with a preset number to provide an output via a gate if the specific pulse event occurs when the number of pulses counted by the counter is equal to the preset number. If the count rises above the preset number the comparator resets the flip-flop and no output is produced by the gate.

4 Claims, 2 Drawing Figures

CIRCUIT FOR RECOGNIZING CYCLICALLY OCCURRING PULSE SEQUENCES

This invention relates to a circuit for recognising cyclically occurring pulse sequences, and finds application, for example, in an internal combustion engine ignition system test apparatus. In such an apparatus it is desirable to be able to distinguish between a cyclic misfire condition in which a misfire occurs at a specific point in each engine cycle and a condition in which misfires occur randomly. The present invention has for its object to provide a circuit for this purpose.

A recognition circuit in accordance with the invention includes a counter and a control logic network therefor, said counter counting the pulses in a pulse sequence following a specific event in said pulse sequence, said logic circuit acting to stop said counter at the next occurrence of said specific event and comparison means for comparing the number of pulses counted with a preset number.

An example of the invention is shown in the accompanying drawings in which.

Figure 1:
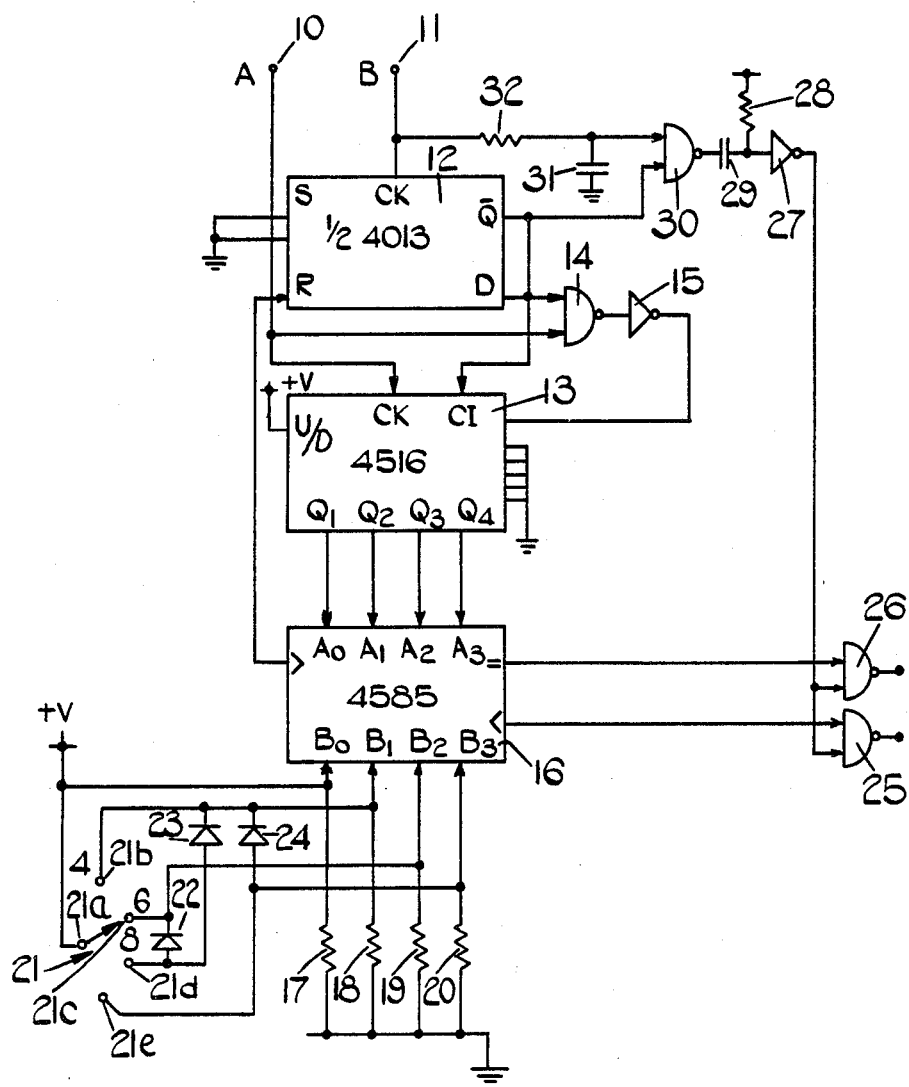
FIG. 1 is a circuit diagram of the recognition circuit.

Referring firstly to FIG. 1 the circuit shown receives inputs at terminals 10 and 11 from a missing pulse detector circuit (not shown) which forms the subject of co-pending application Ser. No. 152,127 of even data (based on U.K. Patent Application No. 7918385). At terminal 10 a train of pulses is received-one pulse for each pulse supplied to the missing pulse detector circuit and shown in trace A in FIGS. 2a to 2c. In this trace a single occurrence of a missing pulse is shown. At terminal 11, a single pulse is received occurring immediately before the pulse following the missing pulse as shown in trace B of FIGS. 2a to 2c.

Terminal 11 is connected to the CLOCK terminal of an integrated circuit D-type flip-flop circuit (type 4013) 12. The SET terminal of this circuit is connected to earth and its Q output is connected to its D input.

The Q output of the flip-flop circuit 12 is also connected to the CARRY IN input of a CMOS integrated circuit 4-bit binary counter (type 4516) 13 and to one input of a NAND gate 14. The CLOCK input of counter 13 and the other input of gate 14 are both connected to the terminal 10. The output of NAND gate 14 is connected via an inverter 15 to the RESET input of counter 13. The PRESET ENABLE and the PRESET DATA inputs of counter 13 are all earthed and its UP/-DOWN input is connected to a +ve supply. The outputs $Q_1$ to $Q_4$ of the counter 13 are connected to the inputs $A_0$ to $A_3$ of a 4-bit digital comparator 16, the B inputs of which are connected to earth by respective resistors 17, 18 19 and 20. A selector switch 21 has a common pole 21a connected to the +ve supply, a first contact 21b connected to the B1 input of comparator 16, a second contact 21c connected to input $B_2$ of the comparator 16, a third contact 21a connected by diodes 22 and 23 to the $B_2$ and $B_1$ inputs of the comparator, and a fourth contact connected directly to the $B_3$ input and by a diode 24 to the $B_1$ input of comparator 16. The $B_0$ input of comparator 16 is connected to the +ve supply.

The A>B output of the comparator 16 is connected to the RESET input of the flip-flop circuit 12. The A=B output of comparator 16 is connected to one input of a NAND gate 26 and the A<B output is connected to one input of a NAND gate 25. The other input of each of gates 25 and 26 is connected to the output of an inverter 27, the input of which is connected by a resistor 28 to the +ve supply and by a capacitor 29 to the output of a NAND gate 30. One input of NAND gate 30 is connected to the Q output of flip-flop circuit 12 and its other input is connected to earth by a capacitor 31 and to the terminal 11 by a resistor 32.

Figure 2A:
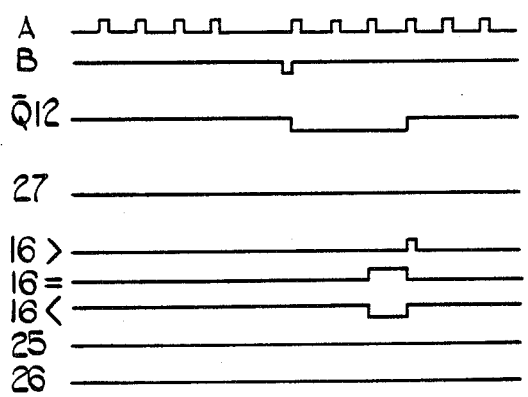
FIGS. 2a to 2c is graphical representation of the waveforms at various points in FIG. 1.

In use until a pulse has been received at the CLOCK terminal of circuit 12, the Q output of the circuit 12 is high so that the signal at the output of inverter 15 is a pulse train in phase with the pulse train at terminal 10, (see trace A, FIG. 2). This pulse train maintains counter 13 reset to zero. When the Q output of circuit 12 goes low as a result of receiving a pulse at terminal 11, these resetting pulses are blocked and the signal at the CARRY IN terminal of counter 13 goes low, so that the pulses at terminal 10, including that immediately following the pulse at terminal 11, are counted. In the arrangement and circumstances actually illustrated in FIGS. 1 and 2a, no further pulse is missing so that when four pulses have been received by counter 13, the comparator A>B output goes high (switch 21 being in the 21b position so that the preset B input to comparator 16 is 0011, and the count of counter 13 then being 0100). This causes flip-flop circuit 12 to be reset and await the next pulse at terminal 11. The output of inverter 27 goes high momentarily only if the Q output of flip-flop circuit 12 is high when the input at terminal 11 goes low. In the case of an isolated missing pulse these circumstances do not arise.

Figure 2B:
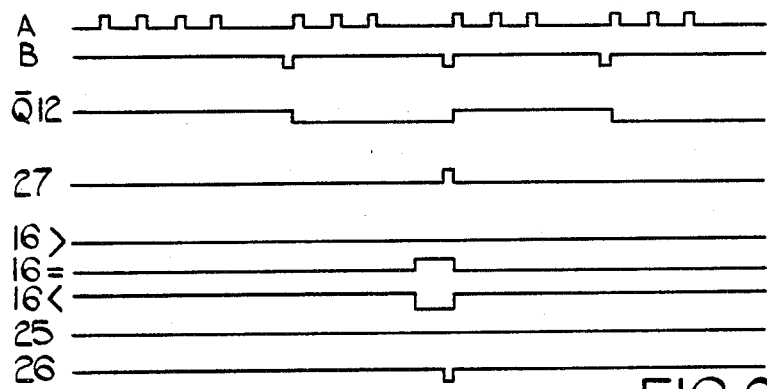

In the situation shown in FIG. 2b a cyclic fault exists, i.e. every fourth pulse is missing. In these circumstances only three pulses are admitted to counter 13 before the next pulse arrives at terminal 11. As a result flip-flop circuit 12 is clocked so that the Q output thereof go high and this prevents further counting up. The output of inverter 27 does now goes high momentarily so that the A=B output of the comparator 16 is strobed through the gate 26.

Figure 2C:
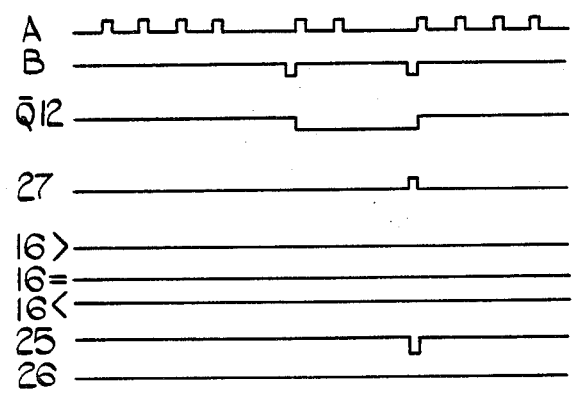

In the situation shown in FIG. 2c there are two missing pulses within a four pulse cycle so that when the Q output of flip-flop circuit 12 goes high the A<B output of comparator 16 is strobed through gate 25.

The recognition circuit described herein forms part of an internal combustion engine spark ignition system test apparatus described in co-pending application Ser. No. 151,929 (based on U.K. Patent Application No. 7918389).

I claim:

1. A circuit for distinguishing specific pulse patterns in a pulse train comprising input means from a detecting means for detecting specific events in the pulse train, a counter, a logic circuit connected to said input means and to said counter and controlling said counter so as to commence counting of the pulses in the pulse train when said logic circuit receives an input from said detecting means and to stop counting either when the next input is received from said detecting means or when a predetermined count has been reached, whichever occurs first, and comparison means connected to the counter output and providing an output signal when the number of pulses counted by the counter on receipt of the next input from the detecting means is less than the predetermined count by one count.

2. A circuit as claimed in claim 1 in which the comparison means is connected to produce different outputs when (a) the number of pulses counted by the counter on receipt of the next input from the detecting means is less than the predetermined count by one count, and (b) the number of pulses counted by the counter on receipt of the next input pulse from the detecting means is less than the predetermined count by more than one count.

3. A circuit as claimed in claim 1 in which said logic circuit includes a bistable flip-flop circuit connected to said detecting means to change state each time said detecting means produces an output signal, a gate circuit connected to receive the pulse train and the output of the flip-flop circuit and having the output connected to said counter for providing resetting pulses to the counter whenever the flip-flop circuit is in one state, said comparison means having a further output connected to a reset input of the flip-flop circuit so as to reset the flip-flop circuit to said one state whenever the comparison means detects that the counter state of the counter is equal to said predetermined count.

4. A circuit as claimed in any of claims 1, 2 or 3 including selector switch means connected to said comparison means for selecting said preset number from a plurality of such numbers.

* * * * *